United States Patent
Yamamoto et al.

(10) Patent No.: US 12,481,229 B2
(45) Date of Patent: Nov. 25, 2025

(54) MARK DETECTING APPARATUS, MARK LEARNING APPARATUS, SUBSTRATE PROCESSING APPARATUS, MARK DETECTING METHOD, AND MANUFACTURING METHOD OF ARTICLE

(71) Applicant: CANON KABUSHIKI KAISHA, Tokyo (JP)

(72) Inventors: Masashi Yamamoto, Kanagawa (JP); Tohru Suzuki, Tochigi (JP); Hisatoshi Neya, Tochigi (JP); Yoshiaki Kurosawa, Tochigi (JP); Shingo Yoneda, Tochigi (JP); Masanori Hioki, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 831 days.

(21) Appl. No.: 17/736,254

(22) Filed: May 4, 2022

(65) Prior Publication Data

US 2022/0365454 A1    Nov. 17, 2022

(30) Foreign Application Priority Data

May 14, 2021   (JP) .................................. 2021-082580

(51) Int. Cl.
*G03F 9/00*   (2006.01)

(52) U.S. Cl.
CPC .......... *G03F 9/7088* (2013.01); *G03F 9/7092* (2013.01)

(58) Field of Classification Search
CPC .... G03F 9/7088; G03F 9/7092; G03F 9/7046; G03F 7/70491; G03F 9/7049

(Continued)

(56) References Cited

U.S. PATENT DOCUMENTS

| 2004/0189963 A1* | 9/2004 | Ohsaki | G03F 9/7088 |
| | | | 356/399 |
| 2005/0211918 A1* | 9/2005 | Oishi | G03F 9/7088 |
| | | | 250/492.1 |

(Continued)

FOREIGN PATENT DOCUMENTS

| CN | 108886004 A | 11/2018 |
| CN | 112309909 A | 2/2021 |

(Continued)

OTHER PUBLICATIONS

JP2021051200 (Year: 2021).*

(Continued)

*Primary Examiner* — Caleen O Sullivan
(74) *Attorney, Agent, or Firm* — Carter, DeLuca & Farrell LLP

(57) ABSTRACT

A mark detecting apparatus includes an imaging unit configured to generate an alignment mark image by imaging of an alignment mark on an object, a detecting unit configured to detect the alignment mark in the alignment mark image, and an adjusting unit configured to adjust a parameter relating to the imaging, based on a learning model generated by learning using the alignment mark image in which the alignment mark could not be detected and a first parameter as the parameter for the imaging of the alignment mark image in which the alignment mark could be detected. The adjusting unit acquires a second parameter as a result of inference processing based on the learning model. The imaging unit performs the imaging in a state where the parameter is adjusted to the second parameter.

9 Claims, 6 Drawing Sheets

(58) Field of Classification Search
USPC .................. 430/22; 355/30, 33, 50, 53, 67
See application file for complete search history.

(56) References Cited

U.S. PATENT DOCUMENTS

| | | | |
|---|---|---|---|
| 2006/0285740 | A1 | 12/2006 | Okita |
| 2009/0091722 | A1 | 4/2009 | Egashira |
| 2017/0270961 | A1 | 9/2017 | Tajima |
| 2021/0389683 | A1 | 12/2021 | Tel |
| 2023/0408932 | A1* | 12/2023 | Coskun ................ G03F 9/7003 |

FOREIGN PATENT DOCUMENTS

| | | |
|---|---|---|
| CN | 112558435 A | 3/2021 |
| JP | H10-256350 A | 9/1998 |
| JP | 2003-338455 A | 11/2003 |
| JP | 2012-059853 A | 3/2012 |
| JP | 2020-177143 A | 10/2020 |
| JP | 2020-535484 A | 12/2020 |
| JP | 2021-051200 A | 4/2021 |
| KR | 10-2021-0036264 A | 4/2021 |
| TW | 201633193 A | 9/2016 |
| TW | 202020576 A | 6/2020 |
| TW | 202036765 A | 10/2020 |
| TW | 202113510 A | 4/2021 |
| WO | 2006/129711 A1 | 12/2006 |
| WO | 2021083608 A1 | 5/2021 |

OTHER PUBLICATIONS

Taiwan Office Action issued Nov. 8, 2024 in corresponding TW Patent Application No. 111114595, with English translation.
Notice of Reasons for Refusal issued by the Japanese Patent Office on Nov. 26, 2024 in corresponding JP Patent Application No. 2021-082580, with English translation.
Notice of Reasons for Refusal issued by the Japanese Patent Office on Mar. 11, 2025 in corresponding JP Patent Application No. 2021-082580, with English Translation.
Korean Office Action issued in corresponding KR Patent Application No. 10-2022-0057022, dated Apr. 1, 2025, with English translation.
Taiwan Office Action issued in corresponding TW Patent Application No. 111114595, dated Jul. 16, 2025, with English translation.
Chinese Office Action issued by the China National Intellectual Property Administration on Augustcorresponding CN Patent Application No. 202210504569.6, with English translation.

* cited by examiner

| PARAMETERS TO BE ADJUSTED | ADJUSTING UNIT |
|---|---|
| ALIGNMENT MARK POSITION IN OBSERVATION FIELD OF VIEW | OBJECT LENS DRIVING UNIT 132<br>MASK STAGE DRIVING UNIT 135<br>PLATE STAGE DRIVING UNIT 136 |
| WAVELENGTH OF OBSERVATION LIGHT | OBSERVATION LIGHT UNIT 133<br>WAVELENGTH CORRECTING UNIT 134 |
| LUMINANCE OF OBSERVATION LIGHT | OBSERVATION LIGHT UNIT 133 |

MARK DETECTING APPARATUS, MARK LEARNING APPARATUS, SUBSTRATE PROCESSING APPARATUS, MARK DETECTING METHOD, AND MANUFACTURING METHOD OF ARTICLE

BACKGROUND OF THE INVENTION

Field of the Invention

The present invention relates to a technology for detecting an alignment mark from image data acquired by imaging the alignment mark.

Description of the Related Art

The alignment mark described above is detected, for example, in an exposure apparatus that manufactures a semiconductor device or a display device using the photolithography technology. The exposure apparatus projects a pattern of an original, such as a mask and a reticle, onto a substrate, such as a wafer and a glass plate via a projection optical system and transfers the pattern. In transferring a plurality of layers having different original patterns on the same substrate, a highly accurate alignment is required so as to prevent an actual transfer position from shifting from a target transfer position. Using image data (alignment mark image) acquired by imaging an alignment mark, the alignment detects the position of the alignment mark and corrects the position based on the result.

Japanese Patent Laid-Open No. ("JP") 2003-338455 discloses a method of detecting a position of an alignment mark in an alignment mark image through template matching, which is an optimizing method using automatic deformation of the template corresponding to the deformation of the alignment mark and a change in brightness. This method self-learns so as to use the optimized template for the next matching and improves the detecting rate of the alignment mark.

However, even the method disclosed in JP 2003-338455 requires the operator to first manually adjust the alignment mark position to the imaging position, to adjust a plurality of parameters, such as a wavelength and illuminance of imaging light, and to maintain a good imageable state of the alignment mark. At this time, it takes time for the operator to determine a combination of parameters to be used. Since the state of the alignment mark in the alignment mark image changes according to the physical property of resist applied to a substrate, the operator needs sufficient knowledge to determine the combination.

Some exposure apparatuses can automatically adjust the parameters, but this type of exposure apparatuses automatically and sequentially change the combination of parameters and determine whether the combination is proper. Therefore, it takes a long time to determine the combination of parameters to be used.

SUMMARY OF THE INVENTION

The present invention provides an alignment mark detecting apparatus, etc., each of which can automatically and quickly adjust parameters relating to imaging for acquiring a good alignment mark image.

A mark detecting apparatus according to one aspect of the present invention includes an imaging unit configured to generate an alignment mark image by imaging of an alignment mark on an object, a detecting unit configured to detect the alignment mark in the alignment mark image, and an adjusting unit configured to adjust a parameter relating to the imaging, based on a learning model generated by learning using the alignment mark image in which the alignment mark could not be detected and a first parameter as the parameter for the imaging of the alignment mark image in which the alignment mark could be detected. The adjusting unit acquires a second parameter as a result of inference processing based on the learning model. The imaging unit performs the imaging in a state where the parameter is adjusted to the second parameter. A mark detecting method corresponding to the above mark detecting apparatus, and a substrate processing apparatus and a manufacturing method of an article, each of which uses the above mark detecting apparatus also constitute another aspect of the present invention.

A mark learning apparatus according to another aspect of the present invention includes an acquiring unit configured to acquire an alignment mark image that is an image generated by imaging of an alignment mark on an object in which the alignment mark in the image could not be detected, and a first parameter as a parameter relating to the imaging in the imaging of the alignment mark image in which the alignment mark could be detected, and a learning unit configured to generate a learning model for use with inference processing that outputs a second parameter as the parameter by learning using the acquired alignment mark image and the first parameter.

Further features of the present invention will become apparent from the following description of exemplary embodiments with reference to the attached drawings.

DESCRIPTION OF THE EMBODIMENTS

Referring now to the accompanying drawings, a description will be given of embodiments according to the present invention.

First Embodiment

Figures 1, 2:
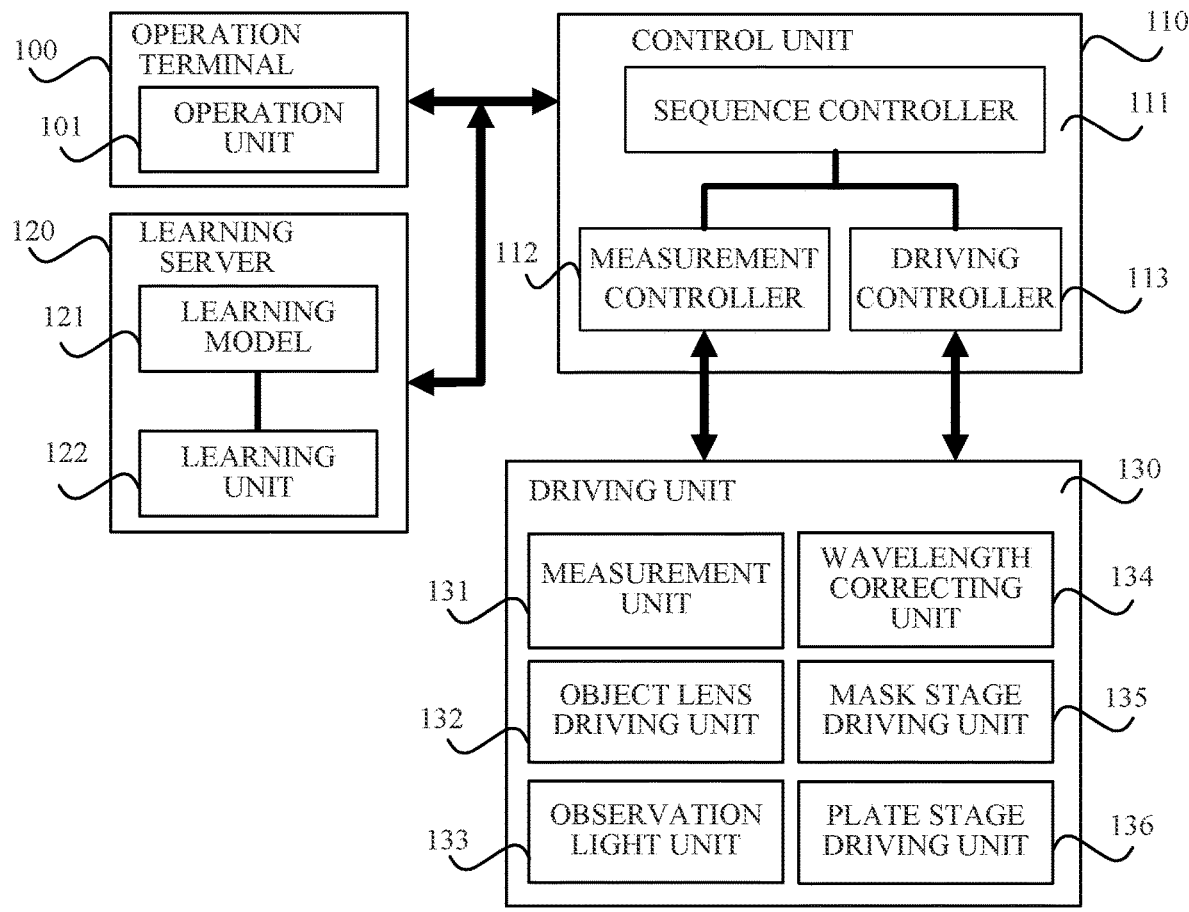
FIG. 1 is a block diagram illustrating a configuration of a mark detecting apparatus according to a first embodiment.
FIG. 2 illustrates a relationship between parameters to be adjusted and an adjusting unit according to the first embodiment.

FIG. 1 illustrates a configuration (mark detecting apparatus) relating to an alignment mark measurement in an exposure apparatus according to a first embodiment. The exposure apparatus includes an operation terminal 100, a control unit 110, a learning server 120, and a driving unit 130. A sequence controller 111 in the control unit 110 issues measurement and driving instructions to a measurement controller 112 and a driving controller 113, respectively, in accordance with a command from the operation terminal 100 operated by an operator, and performs sequence control.

The measurement controller 112 communicates with the driving unit 130 to control a measurement unit 131, an observation light unit 133, and a wavelength correcting unit 134 in the driving unit 130. The measurement unit 131 as an imaging unit images an alignment mark provided on an object such as a mask or a plate (substrate) in an observation field of view (imaging area) and generates an alignment image. The observation light unit 133 includes a plurality of light sources such as LEDs having different wavelengths from each other. The wavelength correcting unit 134 controls reflected light from the mask or plate to correct the wavelength of the light to be imaged by the measurement unit 131.

The driving controller 113 communicates with the driving unit 130 to control an objective lens driving unit 132, a mask stage driving unit 135, and a plate stage driving unit 136 in the driving unit 130. The objective lens driving unit 132 moves the objective lens for transferring a mask pattern onto the plate by exposure. The mask stage driving unit 135 and the plate stage driving unit 136 move stages that supports the mask and plate, respectively.

The operation terminal (operation unit) 100 includes an operation unit 101 that enables adjustments of a plurality of parameters relating to imaging for acquiring an alignment mark image, and adjusts the parameters according to the operation of the operation unit 101 by the operator. The plurality of parameters relating to imaging are values, and when the parameters are changed, the state (such as the brightness, the contrast, and the position) of the alignment mark in the alignment mark image is changed.

The learning server (alignment mark learning apparatus) 120 includes a learning model 121 for acquiring (inferring) the combination of suitable parameters, and a learning unit 122 for updating the learning model 121.

Imaging for acquiring the alignment mark image in the exposure apparatus is performed by the measurement unit 131 after the parameters illustrated in FIG. 2 are adjusted and the imaging condition is set. More specifically, the position of the alignment mark in the observation field of view of the measurement unit 131 is adjusted by driving the objective lens driving unit 132, the mask stage driving unit 135, and the plate stage driving unit 136. During imaging, the inside of the observation field of view is illuminated by the observation light. The wavelength of the observation light is adjusted by switching the current light source to another light source having a different wavelength in the observation light unit 133, by adjusting an aperture stop (diaphragm) disposed on the observation light path to cut out the light in a specific wavelength band, and by suppressing the specular reflected light using the wavelength correcting unit 134. The illuminance of the observation light is adjusted by increasing or decreasing a current value input to the light source in the observation light unit 133 to change an emission light amount.

Figure 3:
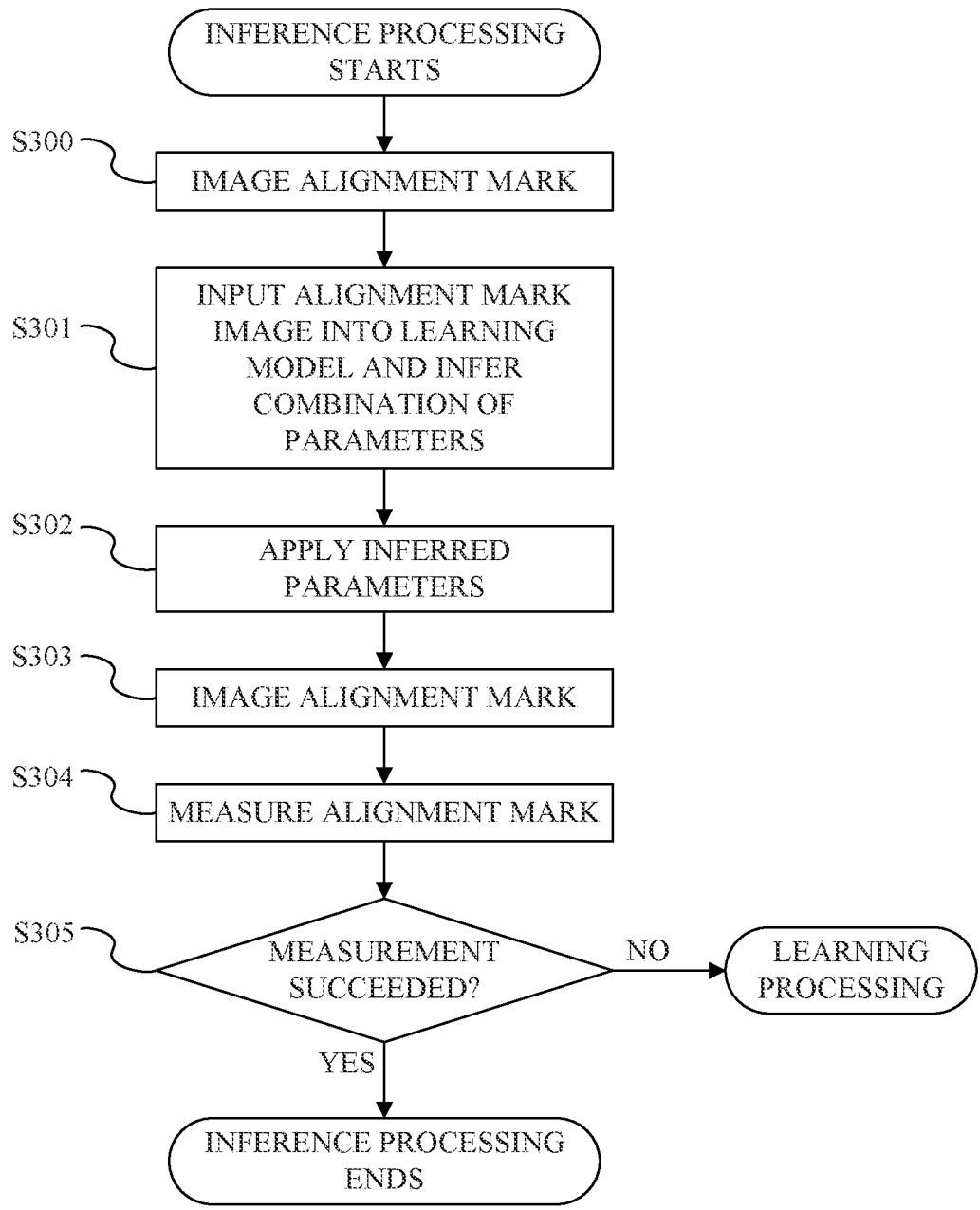
FIG. 3 is a flowchart illustrating parameter inference processing according to the first embodiment.

A flowchart of FIG. 3 illustrates inference processing for inferring a suitable combination of parameters using the learning model 121 that receives an input of the alignment mark image obtained by imaging by the measurement unit 131. The control unit 110 (including the sequence controller 111, the measurement controller 112, and the driving controller 113) including a computer executes this processing according to a computer program. The control unit 110 corresponds to the detecting apparatus and the adjusting unit.

First, the sequence controller 111 issues a command to the measurement controller 112 and the driving controller 113 to measure the position of the alignment mark. In response, the driving controller 113 acquires the combination of parameters (referred to as initial parameters hereinafter) previously held by the operation terminal 100 and sets them to each unit in the driving unit 130. Thereby, the alignment mark position moves to a position corresponding to the initial parameters inside or outside the observation field of view, and the wavelength and illuminance of the observation light from the observation light unit 133 are set according to the initial parameters.

In the step S300, the measurement controller 112 causes the measurement unit 131 to image the alignment mark. The alignment mark image obtained by the imaging here is set to a first alignment mark image.

In the step S301, the sequence controller 111 inputs the first alignment mark image to the learning model 121 in the learning server 120. The learning model 121 outputs the combination of suitable parameters (second parameter: referred to as inferred parameters hereinafter) as an inference result.

The learning model 121 is generated by machine learning using various alignment mark images whose measurements failed in the past and parameters (first parameters) for imaging of the alignment mark images whose measurements succeeded. However, the learning model 121 does not have to be generated in the exposure apparatus according to this embodiment, and it may be a learning model generated by another exposure apparatus or a learning model generated using an alignment mark image acquired from the outside and a log of parameters.

The machine learning can be performed using, for example, a convolutional neural network. The convolutional neural network is an algorithm that has an input layer, a convolutional layer, a pooling layer, a fully connected layer, and an output layer, accepts inputs of images, and outputs one inference result. This embodiment discusses the learning model 121 using the convolutional neural network, but the learning model 121 may be generated with another model or algorithm.

In the step S302, the sequence controller 111 applies the combination of inferred parameters output from the learning model 121 to each unit in the driving unit 130 through the measurement controller 112 and the driving controller 113. Thereby, each parameter relating to imaging is adjusted to the inferred parameter.

Then, in the step S303 after the inferred parameters are applied, the sequence controller 111 causes the measurement unit 131 to image the alignment mark again through the measurement controller 112. The alignment image obtained by the imaging is set to a second alignment mark image.

Figure 4:
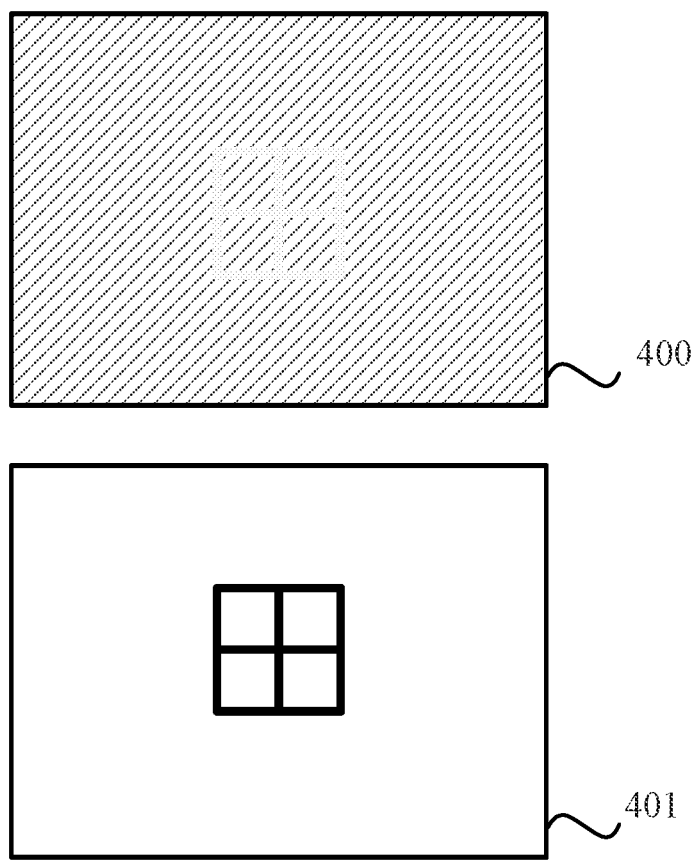
FIG. 4 illustrates alignment mark images having different illuminances of observation light.

FIG. 4 illustrates an example of a first alignment mark image and a second alignment mark image. In the case where the illuminance of the observation light set by the initial parameter is as low as 20%, for example, the first alignment mark image 400 with insufficient brightness or low contrast is obtained. As the illuminance of the observed light becomes as high as 70%, for example, by applying the inferred parameters obtained by inputting the first alignment mark image 400 into the learning model 121, a second alignment mark image 401 with high brightness or high contrast is obtained.

Figure 5:
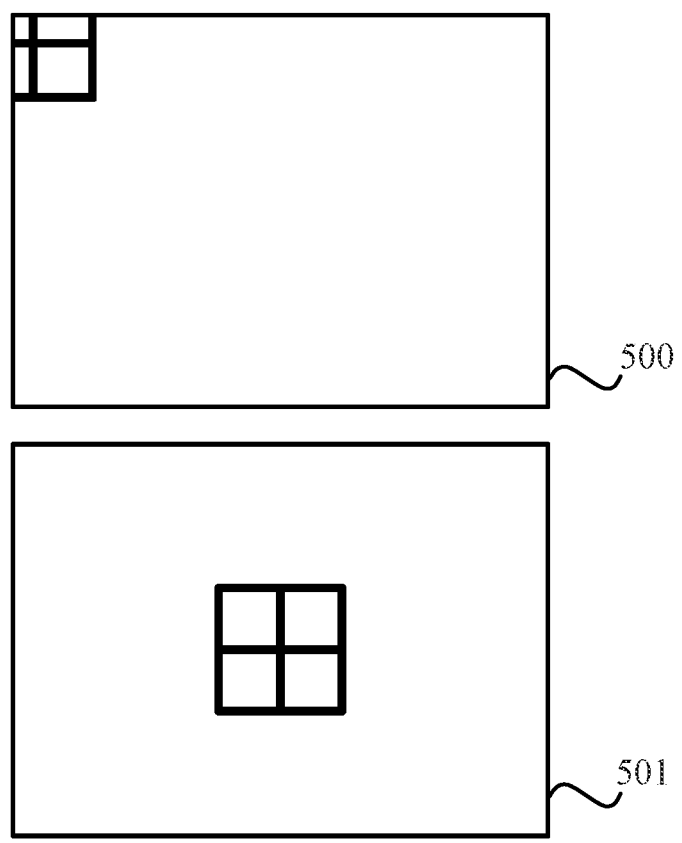
FIG. 5 illustrates alignment mark images having different positions of alignment marks in an observation field of view.

FIG. 5 illustrates another example of a first alignment mark image and a second alignment mark image. In the case where the alignment mark set by the initial parameters is located at least partially outside the observation field of view, a first alignment mark image 500 is obtained in which at least its part is missing. When the first alignment mark image 500 is input to the learning model 121, a plate stage driving amount is output as an inferred parameter. When the plate stage driving unit 136 drives the plate stage mounted with the plate by this plate stage driving amount, the alignment mark is located at the center of the observation field of view. Thereby, a second alignment mark image 501 with the alignment mark located at the center is obtained.

In the step S304, the sequence controller 111 measures the position of the alignment mark in the second alignment mark image. Then, in the step S305, the sequence controller 111 determines whether or not the measurement has been successful (in other words, whether or not the alignment mark has been detected). In the case where the alignment mark position has been successfully measured, the inference processing is terminated. In the case where the measurement of the alignment mark position has been unsuccessful (failed), the flow proceeds to the learning processing described below.

This embodiment can automatically and quickly adjust parameters relating to imaging for acquiring the good alignment mark image using the learning model that accepts inputs of the alignment mark image. In addition, this embodiment can position the mask or plate with high accuracy using the good alignment mark image.

Figure 6:
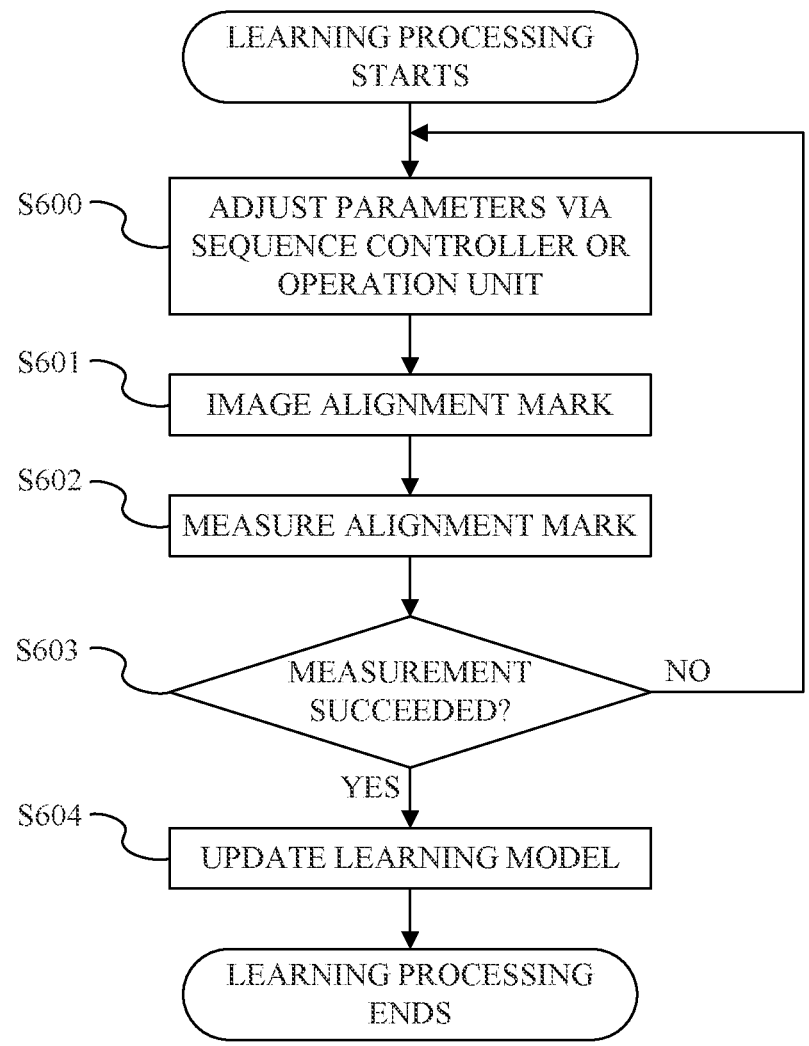
FIG. 6 is a flowchart illustrating parameter learning processing according to the first embodiment.

A flowchart of FIG. 6 illustrates learning processing (learning model generating method). In this description, the learning processing is executed in the case of the unsuccessful measurement of the alignment mark position in the second alignment mark image obtained by imaging with the combination of inferred parameters obtained by the inference processing. A case where the learning processing is executed is not limited to this case.

First, in the step S600, the sequence controller 111 automatically adjusts the combination of parameters that enables measurement in accordance with a predetermined adjustment procedure. At this time, the sequence controller 111 searches for a combination of parameters that enables the measurement while driving the objective lens driving unit 132, the observation light unit 133, and the wavelength correcting unit 134 according to a predetermined rule through the measurement and driving controllers 112 and 113. In this step, the sequence controller 111 may acquire the combination of parameters input by the operator through the operation unit 101.

Next, in the step S601, the sequence controller 111 applies the combination of parameters obtained in the step S600 through the measurement and driving controllers 112 and 113 to each unit in the driving unit 130, so as to cause the measurement unit 131 to image the alignment mark.

Next, in the step S602, the sequence controller 111 measures the position of the alignment mark in the alignment mark image obtained by imaging. Then, in the step S603, the sequence controller 111 determines whether or not the measurement has been successful. In the case where the measurement has been successful, the sequence controller 111 causes the learning unit 122 to update the learning model 121 in the step S604. The learning unit 122 corresponds to the acquiring unit and the learning unit.

In the update of the learning model 121, the sequence controller 111 causes the learning unit 122 to learn with inputs of the first alignment mark image of which the measurement has failed and the combination of parameters (referred to as successful parameters hereinafter) that has made the measurement successful in the step S602 as described above. For example, an error backpropagation method is applicable when the learning is machine learning using the convolutional neural network.

The machine learning using the convolutional neural network sets the combination of successful parameters to ground truth data, and the combination of inferred parameters obtained with the learning model 121 to output data. It adjusts weights between neurons so as to reduce an error between the ground truth data and the output data. The error between the ground truth data and the output data can use a square sum error expressed by the following expression (1) or a cross entropy error expressed by the expression (2). In each expression, E is an error value, y is an output data value, and t is a correct data value.

$$E = \frac{1}{2}\sum_{k}(y_k - t_k)^2 \quad (1)$$

$$E = -\sum_{k} t_k \log y_k \quad (2)$$

At this time, the learning model 121 is updated using the first alignment mark image acquired in the inference processing.

In the case where the measurement of the alignment mark has been successful (failed) in the step S602, the flow returns to step S600 to repeat the processing described above.

This embodiment inputs the alignment mark image and can optimize the learning model for inferring the parameters for imaging automatically or with a small burden on the operator.

This embodiment has been applied to an exposure apparatus as a substrate processing apparatus that exposes a substrate positioned by using an alignment mark detected by the mark detecting apparatus and forms a pattern on the substrate, but this embodiment is applicable to another substrate processing apparatus. For example, this embodiment is also applicable to an imprinting apparatus that forms a pattern made of an imprint material on a substrate using a mold, or a substrate processing apparatus such as a drawing apparatus that irradiates a charged particle beam onto a substrate and forms a pattern on the substrate. This embodiment is also applicable to a substrate processing apparatus such as a coater for applying a photosensitive medium onto a surface of a substrate and a developer for developing a photosensitive medium on which a pattern is transferred. This embodiment is also applicable to a substrate processing apparatus such as a film-forming apparatus (such as a CVD apparatus), a processing apparatus (such as a laser processing apparatus), an inspection apparatus (such as an overlay inspection apparatus), and a measuring apparatus (such as a mark measuring apparatus).

Figure 8:
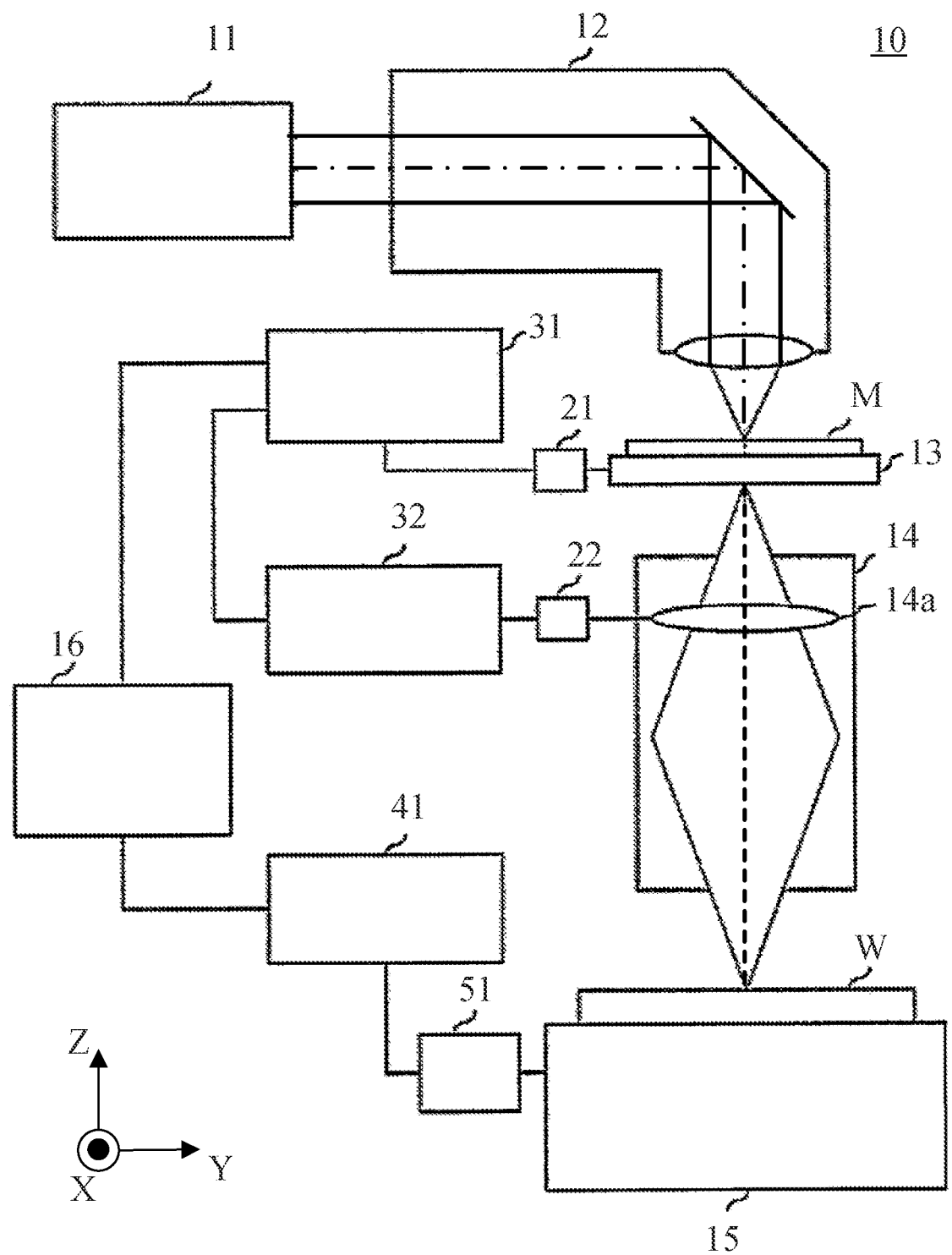
FIG. 8 illustrates a configuration of an exposure apparatus including the mark detecting apparatus according to the first embodiment.

FIG. 8 illustrates a configuration of an exposure apparatus 10. The exposure apparatus 10 projects an image of a pattern of a mask M onto a plate W as a substrate via a projection optical system (objective lens) 14 to expose the plate W. The plate W and the mask M are provided with alignment marks detected by the mark detecting apparatus.

A Z-axis direction is set to a direction parallel to an optical axis of the projection optical system 14, and an X-axis direction and a Y-axis direction are set to two directions orthogonal to each other in a plane perpendicular to the Z-axis direction. θX, θY, and θZ are set to a rotation around the X-axis, a rotation around the Y-axis, and a rotation around the Z-axis, respectively.

The exposure apparatus 10 includes a light source 11, an illumination optical system 12, a mask stage 13, the projection optical system 14, a plate stage 15, and a main control unit 16. The exposure apparatus 10 includes a mask stage driving unit 21 (135 in FIG. 1) for driving the mask stage 13 and an objective lens driving unit 22 (132 in FIG. 1) for driving a lens (optical element) 14a in the projection optical system 14. The exposure apparatus 10 includes a plate stage driving unit 51 (136 in FIG. 1) for driving the plate stage 15. The mask stage driving unit 21, the objective lens driving unit 22, and the plate stage driving unit 51 are controlled by a mask stage control unit 31, a lens control unit 32, and a plate stage control unit 41 included in the measurement controller 112 illustrated in FIG. 1, respectively. Elements from the light source 11 to the plate stage control unit 41 correspond to a processing unit for performing processing (pattern formation by exposure) on the plate W.

The main control unit 16 controls the entire operation of the exposure apparatus 10, and includes the control unit 110 and the learning server 120 illustrated in FIG. 1. The operation terminal 100 illustrated in FIG. 1 is connected to the main control unit 16.

The light source 11 emits exposure light. The illumination optical system 12 illuminates the mask M using the light emitted from the light source 11. The mask stage 13 holds the mask M and is moved by the mask stage driving unit 21 in the XY plane orthogonal to the optical axis of the projection optical system 14. The projection optical system 14 projects an image of the pattern of the mask M illuminated by the illumination optical system 12 onto the plate W. The projection optical system 14 includes the lens 14a that is movable in the X-axis direction by the objective lens driving unit 22. The plate stage 15 holds the plate W and is translated or θZ-rotated in the XY plane by the plate stage driving unit 51.

The main control unit 16 controls the mask stage driving unit 21, the objective lens driving unit 22, and the plate stage driving unit 51 via the mask stage control unit 31, the lens control unit 32, and the plate stage control unit 41 according to the measurement result of the position of the alignment mark detected by the mark detecting apparatus. Thereby, the mask M and the plate W are positioned in the XY plane.

The exposure apparatus 10 is suitable for manufacturing an article, such as a microdevice, e.g., a semiconductor device, a device having a fine structure, and a flat panel display. The method for manufacturing the article includes the steps of processing a substrate using the exposure apparatus 10, and manufacturing an article from the substrate processed in the processing step. The manufacturing method may include well-known steps (such as exposure, oxidation, film formation, vapor deposition, doping, flattening, etching, resist stripping, dicing, bonding, and packaging). The method for manufacturing an article using the exposure apparatus 10 is more advantageous than the conventional method in at least one of the performance, quality, productivity, and production cost of the article.

Second Embodiment

Figure 7:
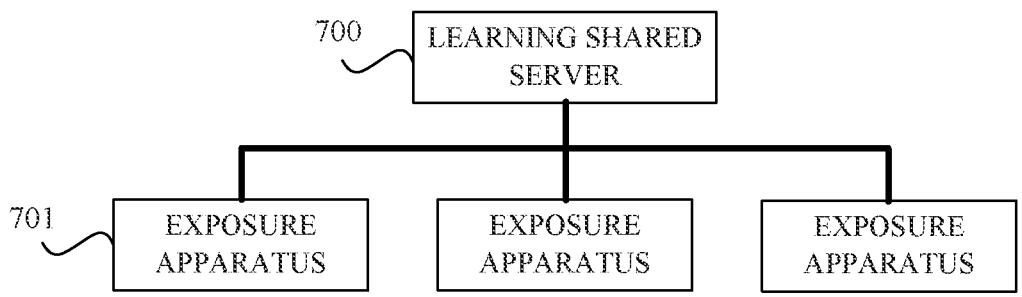
FIG. 7 illustrates a network configuration of a learning shared server according to a second embodiment.

FIG. 7 illustrates a network configuration according to a second embodiment. An exposure apparatus 701 is connected to a learning shared server 700 via a network together with other exposure apparatuses.

In the first embodiment, the inferred parameters are acquired or the learning model is updated using the learning model in a single exposure apparatus (701). On the other hand, this embodiment connects a plurality of exposure apparatuses including the exposure apparatus 701 to the learning shared server 700, and acquires inferred parameters and updates the learning model using the learning model in the learning shared server 700. That is, the learning model is shared by a plurality of exposure apparatuses.

By sharing the learning model among a plurality of exposure apparatuses, inferred parameters can be acquired using the learning model even with a newly installed exposure apparatus that has not been learned. The learning accuracy can be further improved by learning using alignment mark images and successful parameters obtained by a plurality of exposure apparatuses.

The learning shared server 700 may be installed either inside or outside a factory where the exposure apparatus is installed. The same learning shared server 700 may be used by the exposure apparatuses in a plurality of factories through the network.

Other Embodiments

Embodiment(s) of the present invention can also be realized by a computer of a system or apparatus that reads out and executes computer-executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application-specific integrated circuit (ASIC)) for performing the functions of one or more of the above-described embodiment(s), and by a method performed by the computer of the system or apparatus by, for example, reading out and executing the computer-executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer-executable instructions. The computer-executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Using a learning model that accepts an input of an alignment mark image, each embodiment can automatically and quickly adjust parameters relating to imaging for acquiring a good alignment mark image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-082580, filed on May 14, 2021, which is hereby incorporated by reference herein in its entirety.

What is claimed is:

1. A mark detecting apparatus comprising:
an imaging unit configured to generate an alignment mark image by imaging of an alignment mark on an object;
a detecting unit configured to detect the alignment mark in the alignment mark image; and
an adjusting unit configured to adjust a parameter relating to an imaging condition, the imaging condition includes at least one of a position of the alignment mark at an observation field of view, a wavelength of an observation light, and an illuminance of an observation light,
wherein the adjusting unit is configured to adjust the parameter based on an output of a learning model which outputs the parameter inferred by inputting the alignment mark image imaged in an initial parameter,
wherein the learning model is generated by learning using the alignment mark image in which the alignment mark could not be detected and a first parameter as the parameter for the imaging of the alignment mark image in which the alignment mark could be detected,
wherein the adjusting unit acquires a second parameter as a result of inference processing based on the learning model the second parameter is output from the learning model, and
wherein the imaging unit performs the imaging in a state where the parameter is adjusted from the initial parameter to the second parameter.

2. The mark detecting apparatus according to claim 1, further comprising a learning unit configured to learn to generate the learning model.

3. The mark detecting apparatus according to claim 2, wherein the learning unit performs the learning in a case where the alignment mark in the alignment mark image generated by the imaging could not be detected while the parameter is adjusted to the second parameter.

4. The mark detecting apparatus according to claim 1,
wherein the adjusting unit is configured to adjust only an imaging condition that needs to be adjusted for the initial parameter.

5. The mark detecting apparatus according to claim 4, wherein the learning model outputs a position of the alignment mark at an observation field of view, a wavelength of an observation light, and an illuminance of an observation light as the second parameter,
wherein the adjusting unit is configured to adjust only an imaging condition that needs to be adjusted for the initial parameter.

6. A mark detecting method comprising the steps of:
generating an alignment mark image by imaging of an alignment mark on an object;
detecting the alignment mark in the alignment mark image; and
adjusting a parameter relating to an imaging condition, the imaging condition includes at least one of a position of the alignment mark at an observation field of view, a wavelength of an observation light, and an illuminance of an observation light,
wherein the adjusting step includes adjusting the parameter based on an output of a learning model which outputs the parameter inferred by inputting the alignment mark image imaged in an initial parameter,
wherein the learning model is generated by learning using the alignment mark image in which the alignment mark could not be detected and a first parameter as the parameter for the imaging of the alignment mark image in which the alignment mark could be detected,
wherein the adjusting step acquires a second parameter as a result of inference processing based on the learning model, the second parameter is output from the learning model, and
wherein the imaging is performed in a state where the parameter is adjusted from the initial parameter to the second parameter.

7. A storage medium storing a program that causes a computer to execute a mark detecting method,
wherein the mark detecting method includes the steps of:
generating an alignment mark image by imaging of an alignment mark on an object;
detecting the alignment mark in the alignment mark image; and
adjusting a parameter relating to an imaging condition, the imaging condition includes at least one of a position of the alignment mark at an observation field of view, a wavelength of an observation light, and an illuminance of an observation light,
wherein the adjusting step includes adjusting the parameter based on an output of a learning model which outputs the parameter inferred by inputting the alignment mark image imaged in an initial parameter,
wherein the learning model is generated by learning using the alignment mark image in which the alignment mark could not be detected and a first parameter as the parameter for the imaging of the alignment mark image in which the alignment mark could be detected,
wherein the adjusting step acquires a second parameter as a result of inference processing based on the learning model, the second parameter is output from the learning model and
wherein the imaging is performed in a state where the parameter is adjusted from the initial parameter to the second parameter.

8. A substrate processing apparatus comprising:
a mark detecting apparatus; and
a processing unit configured to process a substrate positioned by using an alignment mark detected by the mark detecting apparatus,
wherein the mark detecting apparatus includes:
an imaging unit configured to generate an alignment mark image by imaging of an alignment mark on an object;
a detecting unit configured to detect the alignment mark in the alignment mark image; and
an adjusting unit configured to adjust a parameter relating to an imaging condition, the imaging condition includes at least one of a position of the alignment mark at an observation field of view, a wavelength of an observation light, and an illuminance of an observation light,
wherein the adjusting unit is configured to adjust the parameter based on an output of a learning model which outputs the parameter inferred by inputting the alignment mark image imaged in an initial parameter,
wherein the learning model is generated by learning using the alignment mark image in which the alignment mark could not be detected and a first parameter as the parameter for the imaging of the alignment mark image in which the alignment mark could be detected,
wherein the adjusting unit acquires a second parameter as a result of inference processing based on the learning model, the second parameter is output from the learning model and
wherein the imaging unit performs the imaging in a state where the parameter is adjusted from the initial parameter to the second parameter.

9. A manufacturing method of an article, the manufacturing method comprising the steps of:
- processing a substrate using a substrate processing apparatus; and
- manufacturing the article from a processed substrate, wherein the substrate processing apparatus includes:
- a mark detecting apparatus; and
- a processing unit configured to process a substrate positioned by using an alignment mark detected by the mark detecting apparatus, wherein the mark detecting apparatus includes:
- an imaging unit configured to generate an alignment mark image by imaging of an alignment mark on an object;
- a detecting unit configured to detect the alignment mark in the alignment mark image; and
- an adjusting unit configured to adjust a parameter relating to the imaging, based on a learning model generated by learning using the alignment mark image in which the alignment mark could not be detected and a first parameter as the parameter for the imaging of the alignment mark image in which the alignment mark could be detected, wherein the adjusting unit acquires a second parameter as a result of inference processing based on the learning model, and wherein the imaging unit performs the imaging in a state where the parameter is adjusted to the second parameter.

* * * * *